(12) United States Patent
Rokusha

(10) Patent No.: US 12,503,649 B2
(45) Date of Patent: *Dec. 23, 2025

(54) POROUS LIQUID CRYSTAL POLYMER SHEET, METAL LAYER-ATTACHED POROUS LIQUID CRYSTAL POLYMER SHEET, AND ELECTRONIC CIRCUIT BOARD

(71) Applicant: Murata Manufacturing Co., Ltd., Nagaokakyo (JP)

(72) Inventor: Yuki Rokusha, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 56 days.

This patent is subject to a terminal disclaimer.

(21) Appl. No.: 18/322,764

(22) Filed: May 24, 2023

(65) Prior Publication Data

US 2023/0295506 A1 Sep. 21, 2023

Related U.S. Application Data

(63) Continuation of application No. PCT/JP2022/023141, filed on Jun. 8, 2022.

(30) Foreign Application Priority Data

Jun. 9, 2021 (JP) .................. 2021-096552

(51) Int. Cl.
C09K 19/10 (2006.01)
C09K 19/06 (2006.01)
H05K 1/03 (2006.01)

(52) U.S. Cl.
CPC ............ C09K 19/10 (2013.01); C09K 19/062 (2013.01); H05K 1/03 (2013.01)

(58) Field of Classification Search
CPC ...................................... C09K 19/10
See application file for complete search history.

(56) References Cited

U.S. PATENT DOCUMENTS

| 5,545,475 | A | 8/1996 | Korleski |
| 7,294,393 | B2 | 11/2007 | Murai et al. |
| 8,294,040 | B2 | 10/2012 | Shimizu et al. |
| 2009/0008142 | A1 | 1/2009 | Shimizu et al. |

(Continued)

FOREIGN PATENT DOCUMENTS

| CN | 103467984 A | 12/2013 |
| JP | H06098666 A | 12/1994 |

(Continued)

OTHER PUBLICATIONS

International Search Report in PCT/JP2022/023126, mailed Aug. 2, 2022, 2 pages.

(Continued)

*Primary Examiner* — Chanceity N Robinson
(74) *Attorney, Agent, or Firm* — ArentFox Schiff LLP

(57) ABSTRACT

A porous liquid crystal polymer sheet that includes a resin sheet containing a liquid crystal polymer and having pores. The porous liquid crystal polymer sheet has a melt viscosity of 20 Pa·s or more under the conditions of a shear rate of 1000 s$^{-1}$ and a measurement temperature that is 20° C. higher than a melting point of the resin sheet.

14 Claims, 3 Drawing Sheets

(56) References Cited

U.S. PATENT DOCUMENTS

| | | |
|---|---|---|
| 2010/0239744 A1 | 9/2010 | Sato et al. |
| 2019/0202978 A1* | 7/2019 | Washino ................ C08G 63/60 |
| 2021/0060895 A1 | 3/2021 | Tokuyama et al. |
| 2023/0295507 A1 | 9/2023 | Rokusha |

FOREIGN PATENT DOCUMENTS

| | | | |
|---|---|---|---|
| JP | 2000-351864 A | | 12/2000 |
| JP | 2001-072789 A | | 3/2001 |
| JP | 3618760 B2 | | 2/2005 |
| JP | 2008-308669 A | | 12/2008 |
| JP | 2009127024 A | | 6/2009 |
| JP | 2012-224692 A | | 11/2012 |
| JP | 2016051820 A | * | 4/2016 |
| JP | 2017-119378 A | | 7/2017 |
| JP | 2018109090 A | * | 7/2018 |
| JP | 6434195 B2 | | 12/2018 |
| JP | 2019-167484 A | | 10/2019 |
| WO | 2007/097249 A1 | | 8/2007 |
| WO | 2020218140 A1 | | 10/2020 |

OTHER PUBLICATIONS

International Search Report in PCT/JP2022/023141, mailed Aug. 2, 2022, 2 pages.

* cited by examiner

POROUS LIQUID CRYSTAL POLYMER SHEET, METAL LAYER-ATTACHED POROUS LIQUID CRYSTAL POLYMER SHEET, AND ELECTRONIC CIRCUIT BOARD

CROSS REFERENCE TO RELATED APPLICATIONS

The present application is a continuation of International application No. PCT/JP2022/023141, filed Jun. 8, 2022, which claims priority to Japanese Patent Application No. 2021-096552, filed Jun. 9, 2021, the entire contents of each of which are incorporated herein by reference.

FIELD OF THE INVENTION

The present invention relates to a porous liquid crystal polymer sheet, a metal layer-attached porous liquid crystal polymer sheet, and an electronic circuit board.

BACKGROUND OF THE INVENTION

Patent Document 1 discloses, as a method for producing a porous liquid crystal polymer sheet, a method for producing a porous liquid crystal polymer sheet composed of an assembly of fibrils oriented in a certain direction, wherein the method includes: mixing a liquid crystal polymer substance having self-orientation properties and a solvent-soluble amorphous polymer substance at a weight ratio in a range from 70:30 to 40:60; then extruding the mixture into a sheet; and next selectively removing the amorphous polymer substance from the extruded sheet by solvent extraction.

Patent Document 1: Japanese Examined Patent Application Publication No. 6-98666

SUMMARY OF THE INVENTION

Liquid crystal polymer sheets are known as members for improving the dielectric properties of electronic circuit boards, which are used in various electronic devices, in a high-frequency region because liquid crystal polymer sheets have low permittivity.

The inventors of the present invention have studied to further improve the dielectric properties of electronic circuit boards in a high-frequency region by using conventional porous liquid crystal polymer sheets, such as the porous liquid crystal polymer sheet disclosed in Patent Document 1, which includes pores capable of contributing to lower permittivity in addition to a liquid crystal polymer.

However, the studies by the inventors of the present invention have revealed that pressure bonding of metal layers to conventional porous liquid crystal polymer sheets in the production of electronic circuit boards using conventional porous liquid crystal polymer sheets easily causes the pores in the porous liquid crystal polymer sheets to collapse under high temperature and high pressure during pressure bonding. Such a problem of easy collapse of pores in porous liquid crystal polymer sheets under high temperature and high pressure has not been recognized.

The present invention has been made to solve the above problem and aims at providing a porous liquid crystal polymer sheet including pores that are unlikely to collapse under high temperature and high pressure. The present invention also aims at providing a metal layer-attached porous liquid crystal polymer sheet having the porous liquid crystal polymer sheet. The present invention further aims at providing an electronic circuit board having the metal layer-attached porous liquid crystal polymer sheet.

A porous liquid crystal polymer sheet of the present invention includes a resin sheet containing a liquid crystal polymer and having pores, wherein the porous liquid crystal polymer sheet has a melt viscosity of 20 Pa·s or more under conditions of a shear rate of 1000 $s^{-1}$ and a measurement temperature that is 20° C. higher than a melting point of the resin sheet.

A metal layer-attached porous liquid crystal polymer sheet of the present invention includes the porous liquid crystal polymer sheet of the present invention and a metal layer on at least one main surface of the porous liquid crystal polymer sheet.

An electronic circuit board of the present invention includes the metal layer-attached porous liquid crystal polymer sheet of the present invention.

The present invention can provide a porous liquid crystal polymer sheet including pores that are unlikely to collapse under high temperature and high pressure. The present invention can also provide a metal layer-attached porous liquid crystal polymer sheet having the porous liquid crystal polymer sheet. The present invention can further provide an electronic circuit board having the metal layer-attached porous liquid crystal polymer sheet.

DETAILED DESCRIPTION OF THE PREFERRED EMBODIMENTS

A porous liquid crystal polymer sheet of the present invention, a metal layer-attached porous liquid crystal polymer sheet of the present invention, and an electronic circuit board of the present invention will be described below. The present invention is not limited to the following configurations and may be appropriately modified without departing from the spirit of the present invention. A combination of two or more individual preferred configurations described below is also within the present invention.

The porous liquid crystal polymer sheet of the present invention includes a resin sheet containing a liquid crystal polymer and having pores.

In this description, the "sheet" and the "film" are synonyms and not distinguished by their thickness.

Figure 1:
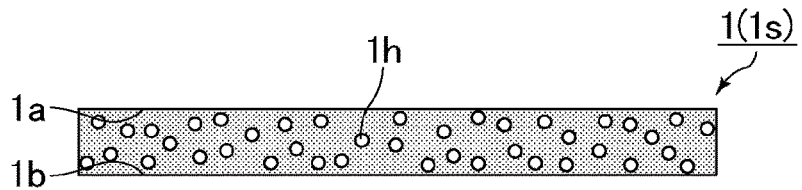
FIG. 1 is a schematic cross-sectional view of an example porous liquid crystal polymer sheet of the present invention.

FIG. 1 is a schematic cross-sectional view of an example porous liquid crystal polymer sheet of the present invention.

A porous liquid crystal polymer sheet 1 illustrated in FIG. 1 has a first main surface $1a$ and a second main surface $1b$. The first main surface $1a$ faces the second main surface $1b$ in the thickness direction.

The porous liquid crystal polymer sheet 1 includes a resin sheet $1s$ containing a liquid crystal polymer. In the porous liquid crystal polymer sheet 1, the resin sheet $1s$ has pores $1h$. More specifically, the resin sheet $1s$ in the porous liquid crystal polymer sheet 1 has the pores $1h$ inside.

The porous liquid crystal polymer sheet of the present invention has a melt viscosity of 20 Pa·s or more under the conditions of a shear rate of 1000 s$^{-1}$ and a measurement temperature that is 20° C. higher than the melting point of the resin sheet.

The porous liquid crystal polymer sheet 1 illustrated in FIG. 1 has a melt viscosity of 20 Pa·s or more under the conditions of a shear rate of 1000 s$^{-1}$ and a measurement temperature that is 20° C. higher than the melting point of the resin sheet $1s$.

The studies by the inventors of the present invention have revealed that pressure bonding of metal layers to conventional porous liquid crystal polymer sheets in the production of electronic circuit boards using conventional porous liquid crystal polymer sheets easily causes the pores in the porous liquid crystal polymer sheets to collapse under high temperature and high pressure during pressure bonding. In electronic circuit boards produced by using conventional porous liquid crystal polymer sheets, the collapsed pores of the porous liquid crystal polymer sheets reduce the effect of the porous liquid crystal polymer sheets on permittivity reduction. As a result, the electronic circuit boards are unlikely to have improved dielectric properties in a high-frequency region.

Since the porous liquid crystal polymer sheet 1 has a melt viscosity of 20 Pa·s or more under the above conditions, the pores $1h$ are unlikely to collapse under high temperature and high pressure upon, for example, pressure bonding of a metal layer to the porous liquid crystal polymer sheet 1 in the production of an electronic circuit board using the porous liquid crystal polymer sheet 1. The electronic circuit board produced by using the porous liquid crystal polymer sheet 1 tends to have improved dielectric properties in a high-frequency region because the porous liquid crystal polymer sheet 1 tends to have an effect on permittivity reduction. In addition, the electronic circuit board produced by using the porous liquid crystal polymer sheet 1 undergoes less change in dielectric properties caused by moisture absorption because the liquid crystal polymer has low hygroscopicity.

If the porous liquid crystal polymer sheet 1 has a melt viscosity of less than 20 Pa·s under the above conditions, the pores $1h$ easily collapse under high temperature and high pressure.

If the melt viscosity of the porous liquid crystal polymer sheet 1 under the above conditions is too high, for example, the porous liquid crystal polymer sheet 1 is difficult to deform upon, for example, pressure bonding of a metal layer to the porous liquid crystal polymer sheet 1, and it may thus be difficult to improve the close contact between the porous liquid crystal polymer sheet 1 and the metal layer. From this point of view, the melt viscosity of the porous liquid crystal polymer sheet 1 under the above conditions is preferably 500 Pa·s or less, more preferably 200 Pa·s or less.

The reason why the melt viscosity of the porous liquid crystal polymer sheet of the present invention is defined at a measurement temperature that is 20° C. higher than the melting point of the resin sheet is to accurately measure the melt viscosity while suppressing degradation of the liquid crystal polymer.

At a temperature lower than the above measurement temperature, it is difficult to obtain the porous liquid crystal polymer sheet in a completely molten state, and it is thus difficult to accurately measure the melt viscosity of the porous liquid crystal polymer sheet. When the melt viscosity of two or more porous liquid crystal polymer sheets is measured, it is also difficult to accurately compare the measurement results of the melt viscosity.

At a temperature higher than the above measurement temperature, the degradation of the liquid crystal polymer is accelerated, so that much noise appears in the measurement results of the melt viscosity of the porous liquid crystal polymer sheet.

The melting point of the resin sheet is determined as described below. First, for example, a resin sheet, which is a porous liquid crystal polymer sheet, is heated and completely melted by using a differential scanning calorimeter, such as differential scanning calorimeter "DSC 7000X" available from Hitachi High-Tech Science Corporation. In the heating process, the heating rate is, for example, 20° C./min. Next, the obtained melted material is cooled and then heated again. In this case, the cooling process involves, for example, cooling to 175° C. at a cooling rate of 20° C./min, and the heating process involves, for example, heating at a heating rate of 20° C./min. The temperature corresponding to the endothermic peak observed in this heating process is defined as the melting point of the resin sheet, which is the porous liquid crystal polymer sheet. If it is difficult to observe the endothermic peak by the method described above, the melting point of the resin sheet, which is the porous liquid crystal polymer sheet, is determined by observing the texture under crossed Nicols in a polarizing microscope.

The melt viscosity of the porous liquid crystal polymer sheet of the present invention under the above conditions is adjusted to 20 Pa·s or more by, for example, the solid phase polymerization of the liquid crystal polymer in the production of the porous liquid crystal polymer sheet. The solid phase polymerization of the liquid crystal polymer elongates the molecular chain of the liquid crystal polymer and thus causes entanglement of the liquid crystal polymer with an elongated molecular chain, which easily increases the melt viscosity of the porous liquid crystal polymer sheet.

The melt viscosity of the porous liquid crystal polymer sheet can also be increased by exposing the liquid crystal polymer to electron beam irradiation as described below although electron beam irradiation has less operational advantage than the solid phase polymerization of the liquid crystal polymer.

The melt viscosity of the porous liquid crystal polymer sheet can also be adjusted by controlling the polymerization conditions, such as the polymerization temperature and polymerization time of the liquid crystal polymer.

The porous liquid crystal polymer sheet of the present invention preferably has a melt tension of 3 mN or more at the above measurement temperature.

The porous liquid crystal polymer sheet 1 illustrated in FIG. 1 preferably has a melt tension of 3 mN or more at the above measurement temperature.

When the porous liquid crystal polymer sheet 1 has a melt viscosity of 20 Pa·s or more under the above conditions and has a melt tension of 3 mN or more at the above measurement temperature, the pores 1h are more unlikely to collapse upon, for example, pressure bonding of a metal layer to the porous liquid crystal polymer sheet 1.

If the melt tension of the porous liquid crystal polymer sheet 1 is too high at the above measurement temperature, the porous liquid crystal polymer sheet 1 is difficult to deform upon, for example, pressure bonding of a metal layer to the porous liquid crystal polymer sheet 1, so that it may be difficult to improve the close contact between the porous liquid crystal polymer sheet 1 and the metal layer. From this point of view, the melt tension of the porous liquid crystal polymer sheet 1 at the above measurement temperature is preferably 20 mN or less, more preferably 10 mN or less, still more preferably 7 mN or less.

The reason why the melt tension of the porous liquid crystal polymer sheet of the present invention is defined at the above measurement temperature is the same as the reason why the melt viscosity is defined at the above measurement temperature.

The melt tension of the porous liquid crystal polymer sheet of the present invention at the above measurement temperature is adjusted to 3 mN or more by, for example, exposing the liquid crystal polymer to electron beam irradiation in the production of the porous liquid crystal polymer sheet. The electron beam irradiation of the liquid crystal polymer accelerates the crosslinking reaction of the liquid crystal polymer to increase the crosslinking points, which easily increases the melt tension of the porous liquid crystal polymer sheet.

The melt tension of the porous liquid crystal polymer sheet can also be increased by the solid phase polymerization of the liquid crystal polymer although the solid phase polymerization has less operational advantage than the electron beam irradiation of the liquid crystal polymer.

The melt tension of the porous liquid crystal polymer sheet can also be adjusted by controlling the polymerization conditions, such as the polymerization temperature and polymerization time of the liquid crystal polymer.

In the porous liquid crystal polymer sheet of the present invention, the resin sheet preferably has a melting point of 275° C. to 330° C.

In the porous liquid crystal polymer sheet 1 illustrated in FIG. 1, the resin sheet is preferably has a melting point of 275° C. to 330° C.

If the melting point of the resin sheet 1s is lower than 275° C., the heat resistance of the resin sheet is may be insufficient when, for example, the electronic circuit board produced by using the porous liquid crystal polymer sheet 1 composed of the resin sheet 1s is integrated into an electronic device by reflow soldering.

If the melting point of the resin sheet 1s is higher than 330° C., for example, the formation of the resin sheet is requires high processing temperatures, which may accelerate degradation of the liquid crystal polymer.

In the porous liquid crystal polymer sheet of the present invention, the liquid crystal polymer preferably contains a copolymer of p-hydroxybenzoic acid and 6-hydroxy-2-naphthoic acid.

In the porous liquid crystal polymer sheet 1 illustrated in FIG. 1, the liquid crystal polymer preferably contains a copolymer of p-hydroxybenzoic acid (HBA) and 6-hydroxy-2-naphthoic acid (HNA).

The copolymer of p-hydroxybenzoic acid and 6-hydroxy-2-naphthoic acid is commonly referred to as a type II wholly aromatic polyester (may also be referred to as type 1.5 wholly aromatic polyester). Type II wholly aromatic polyesters are less subject to hydrolysis than type III partially aromatic polyesters and preferably used as a constituent material of the electronic circuit board produced by using the porous liquid crystal polymer sheet 1. Type II wholly aromatic polyesters have low dissipation factors because of naphthalene rings and contribute to a low electrical energy loss in the porous liquid crystal polymer sheet 1 in the electronic circuit board.

In the porous liquid crystal polymer sheet 1, the liquid crystal polymer may further contain a type I wholly aromatic polyester or a type III partially aromatic polyester, or a type I wholly aromatic polyester and a type III partially aromatic polyester, in addition to the type II wholly aromatic polyester.

The structure (type) of each monomer in the liquid crystal polymer can be analyzed by reactive pyrolysis gas chromatography-mass spectrometry (reactive pyrolysis GC-MS).

In the porous liquid crystal polymer sheet of the present invention, the molar ratio of p-hydroxybenzoic acid to 6-hydroxy-2-naphthoic acid in the liquid crystal polymer is preferably 0.20 to 5.

In the porous liquid crystal polymer sheet 1 illustrated in FIG. 1, the molar ratio of p-hydroxybenzoic acid to 6-hydroxy-2-naphthoic acid in the liquid crystal polymer is preferably 0.20 to 5.

If the molar ratio of p-hydroxybenzoic acid to 6-hydroxy-2-naphthoic acid in the liquid crystal polymer is less than 0.20 or more than 5, the resin sheet is may have a melting point higher than the preferred range described above.

In the porous liquid crystal polymer sheet of the present invention, the liquid crystal polymer preferably contains 10 mol % or more of p-hydroxybenzoic acid and 10 mol % or more of 6-hydroxy-2-naphthoic acid with respect to 100 mol % of the total monomer content.

In the porous liquid crystal polymer sheet 1 illustrated in FIG. 1, the liquid crystal polymer preferably contains 10 mol % or more of p-hydroxybenzoic acid and 10 mol % or more of 6-hydroxy-2-naphthoic acid with respect to 100 mol % of the total monomer content.

If the monomer content of each of p-hydroxybenzoic acid and 6-hydroxy-2-naphthoic acid in the liquid crystal polymer is less than 10 mol %, it may be difficult to realize the following: the liquid crystal polymer exhibits liquid crystallinity, the resin sheet is has a melting point in the preferred range described above, and the liquid crystal polymer has a low dissipation factor.

The monomer ratio and the monomer content for the monomers of the liquid crystal polymer can be analyzed by reactive pyrolysis gas chromatography-mass spectrometry.

The porous liquid crystal polymer sheet of the present invention preferably has a thickness of 10 μm to 200 μm.

The porous liquid crystal polymer sheet 1 illustrated in FIG. 1 preferably has a thickness of 10 μm to 200 μm.

If the porous liquid crystal polymer sheet 1 has a thickness of less than 10 μm, at least one of the first main surface 1a and the second main surface 1b tends to have high porosity in terms of the pores 1h and low smoothness. In this case, when a metal layer is pressure-bonded to the main surface with low smoothness of the porous liquid crystal polymer sheet 1 and then etched into a pattern of wiring or the like, pattern defects tend to appear due to the pores 1h present in the main surface.

If the porous liquid crystal polymer sheet 1 has a thickness of more than 200 μm, it may be difficult to form via holes for forming interconnecting conductors such that the via holes penetrate the porous liquid crystal polymer sheet 1 in the production of electronic circuit boards having interconnecting conductors by using the porous liquid crystal polymer sheet 1.

The thickness of the porous liquid crystal polymer sheet is determined as described below. First, a 100 mm square sample is cut out from the porous liquid crystal polymer sheet. The thickness of a 25 mm square region concentric with the sample is measured at 9 evenly spaced points, and the average thickness is defined as the thickness of the porous liquid crystal polymer sheet. If a 100 mm square sample cannot be cut out from the porous liquid crystal polymer sheet, the thickness of the porous liquid crystal polymer sheet is determined by the same method as that described above except that the porous liquid crystal polymer sheet itself is used as the sample. If the 25 mm square region cannot be obtained in the porous liquid crystal polymer sheet in this case, the thickness of the porous liquid crystal polymer sheet is measured at 9 evenly spaced points, and the average thickness is defined as the thickness of the porous liquid crystal polymer sheet.

The porous liquid crystal polymer sheet 1, more specifically the resin sheet 1s, preferably has a closed-pore structure as the configuration of the pores 1h.

The expression "the porous liquid crystal polymer sheet has a closed-pore structure" means that the porous liquid crystal polymer sheet has pores (bubbles) with their walls entirely surrounded by resin. When the pores with their walls not interconnected with each other are observed in the cross section in the thickness direction of the porous liquid crystal polymer sheet and the cross section in the in-plane direction perpendicular to the thickness direction of the porous liquid crystal polymer sheet, the porous liquid crystal polymer sheet is determined to have a closed-pore structure.

The porous liquid crystal polymer sheet 1 when having a closed-pore structure tends to have fewer passes through which the air in the pores 1h escapes to the outside and higher compressive strength than a porous liquid crystal polymer sheet having an interconnected-pore structure. The porous liquid crystal polymer sheet 1, more specifically the pores 1h, is thus unlikely to collapse upon pressure bonding of a metal layer to the porous liquid crystal polymer sheet 1.

The porous liquid crystal polymer sheet 1 is produced by, for example, the following method.

First, a resin material is prepared by mixing the liquid crystal polymer and a blowing agent at a predetermined ratio.

Next, the resin material is formed into a resin sheet having pores, which is a porous resin sheet, by extrusion molding. Examples of extrusion molding include T-die molding and inflation molding.

The liquid crystal polymer in the porous resin sheet then undergoes one or both of solid phase polymerization and electron beam irradiation to increase the melt viscosity to 20 Pa·s or more under the above conditions.

The porous liquid crystal polymer sheet 1 including the resin sheet is having the pores 1h is produced as described above. The porous liquid crystal polymer sheet 1 has a melt viscosity of 20 Pa·s or more under the above conditions.

The metal layer-attached porous liquid crystal polymer sheet of the present invention includes the porous liquid crystal polymer sheet of the present invention and a metal layer on at least one main surface of the porous liquid crystal polymer sheet.

Figure 2:
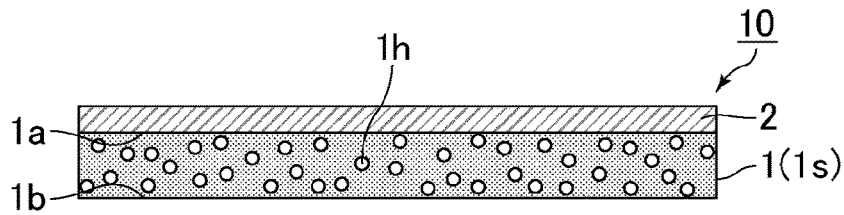
FIG. 2 is a schematic cross-sectional view of an example metal layer-attached porous liquid crystal polymer sheet of the present invention.

FIG. 2 is a schematic cross-sectional view of an example metal layer-attached porous liquid crystal polymer sheet of the present invention.

A metal layer-attached porous liquid crystal polymer sheet 10 illustrated in FIG. 2 includes the porous liquid crystal polymer sheet 1 and a metal layer 2 in the stacking direction.

The stacking direction corresponds to the direction along the thickness direction of the porous liquid crystal polymer sheet of the metal layer-attached porous liquid crystal polymer sheet.

The metal layer 2 is disposed on at least one main surface, the first main surface 1a in this case, of the porous liquid crystal polymer sheet 1. More specifically, the metal layer 2 is adjacent to the first main surface 1a of the porous liquid crystal polymer sheet 1.

The metal layer 2 may be patterned to form wiring or the like or may be planar over the entire surface.

Examples of the constituent material of the metal layer 2 include copper, silver, aluminum, stainless steel, nickel, gold, and alloys containing at least one of these metals.

In the metal layer-attached porous liquid crystal polymer sheet of the present invention, the metal layer is preferably composed of copper foil.

In the metal layer-attached porous liquid crystal polymer sheet 10 illustrated in FIG. 2, the metal layer 2 is preferably composed of copper foil. In this case, the surface of the copper foil may be plated with a metal other than copper.

The thickness of the metal layer 2 is preferably 1 μm to 35 μm, more preferably 6 μm to 18 μm.

The metal layer-attached porous liquid crystal polymer sheet 10 may further include another metal layer on the second main surface 1b of the porous liquid crystal polymer sheet 1, in addition to the metal layer 2.

The metal layer-attached porous liquid crystal polymer sheet 10 is produced by, for example, pressure-bonding the metal layer 2 to the first main surface 1a of the porous liquid crystal polymer sheet 1. The metal layer 2 may be etched into a pattern after being pressure-bonded to the first main surface 1a of the porous liquid crystal polymer sheet 1.

The metal layer-attached porous liquid crystal polymer sheet 10 may be produced by pressure-bonding the patterned metal layer 2 to the first main surface 1a of the porous liquid crystal polymer sheet 1.

An electronic circuit board of the present invention includes the metal layer-attached porous liquid crystal polymer sheet of the present invention.

Figure 3:
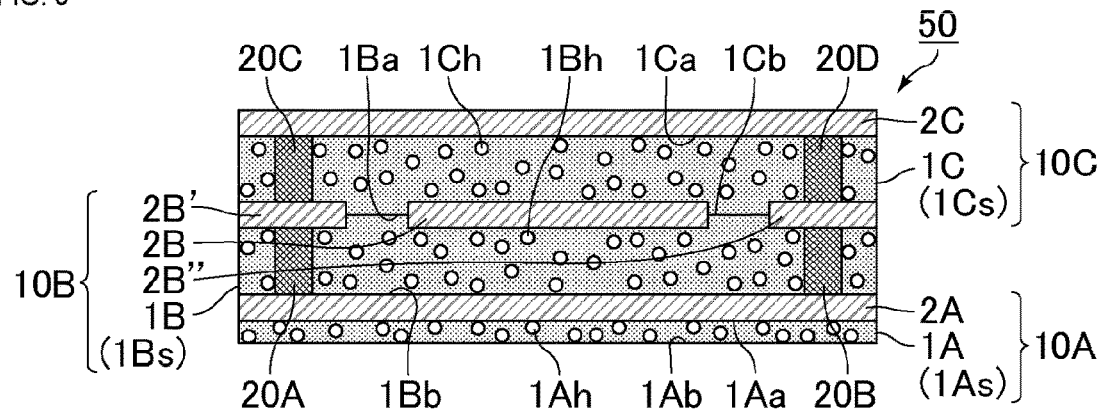
FIG. 3 is a schematic cross-sectional view of an example electronic circuit board of the present invention.

FIG. 3 is a schematic cross-sectional view of an example electronic circuit board of the present invention.

An electronic circuit board 50 illustrated in FIG. 3 includes a metal layer-attached porous liquid crystal polymer sheet 10A, a metal layer-attached porous liquid crystal polymer sheet 10B, and a metal layer-attached porous liquid crystal polymer sheet 10C in order in the stacking direction.

In other words, in the electronic circuit board 50, the metal layer-attached porous liquid crystal polymer sheet 10A, the metal layer-attached porous liquid crystal polymer sheet 10B, and the metal layer-attached porous liquid crystal polymer sheet 10C are stacked in order in the stacking direction.

The metal layer-attached porous liquid crystal polymer sheet 10A includes a porous liquid crystal polymer sheet 1A and a metal layer 2A.

The porous liquid crystal polymer sheet 1A has a first main surface 1Aa and a second main surface 1Ab. The first main surface 1Aa faces the second main surface 1Ab in the thickness direction.

The porous liquid crystal polymer sheet 1A includes a resin sheet 1As containing a liquid crystal polymer. In the porous liquid crystal polymer sheet 1A, the resin sheet 1As has pores 1Ah.

The metal layer 2A is disposed on the first main surface 1Aa of the porous liquid crystal polymer sheet 1A. The metal layer 2A is adjacent to a second main surface 1Bb of a porous liquid crystal polymer sheet 1B described below.

The metal layer-attached porous liquid crystal polymer sheet 10B includes the porous liquid crystal polymer sheet 1B, a metal layer 2B, a metal layer 2B', and a metal layer 2B".

The porous liquid crystal polymer sheet 1B has a first main surface 1Ba and the second main surface 1Bb. The first main surface 1Ba faces the second main surface 1Bb in the thickness direction.

The porous liquid crystal polymer sheet 1B includes a resin sheet 1Bs containing a liquid crystal polymer. In the porous liquid crystal polymer sheet 1B, the resin sheet 1Bs has pores 1Bh.

The metal layer 2B, the metal layer 2B', and the metal layer 2B" are disposed on the first main surface 1Ba of the porous liquid crystal polymer sheet 1B. The metal layer 2B, the metal layer 2B', and the metal layer 2B" are adjacent to a second main surface 1Cb of a porous liquid crystal polymer sheet 1C described below.

The metal layer-attached porous liquid crystal polymer sheet 10C includes the porous liquid crystal polymer sheet 1C and a metal layer 2C.

The porous liquid crystal polymer sheet 1C has a first main surface 1Ca and the second main surface 1Cb. The first main surface 1Ca faces the second main surface 1Cb in the thickness direction.

The porous liquid crystal polymer sheet 1C includes a resin sheet 1Cs containing a liquid crystal polymer. In the porous liquid crystal polymer sheet 1C, the resin sheet 1Cs has pores 1Ch.

The metal layer 2C is disposed on the first main surface 1Ca of the porous liquid crystal polymer sheet 1C.

Referring to FIG. 3, the metal layer 2B is preferably disposed across the interface between the porous liquid crystal polymer sheet 1B and the porous liquid crystal polymer sheet 1C. The interface between the metal layer 2B and the porous liquid crystal polymer sheet 1B and the interface between the metal layer 2B and the porous liquid crystal polymer sheet 1C are thus out of alignment with the interface between the porous liquid crystal polymer sheet 1B and the porous liquid crystal polymer sheet 1C in the stacking direction. This configuration prevents or reduces peeling at the interface between the metal layer 2B and the porous liquid crystal polymer sheet 1B and peeling at the interface between the metal layer 2B and the porous liquid crystal polymer sheet 1C.

Like the metal layer 2B, the metal layer 2B' and the metal layer 2B" are preferably disposed across the interface between the porous liquid crystal polymer sheet 1B and the porous liquid crystal polymer sheet 1C.

The interface between the porous liquid crystal polymer sheet 1B and the porous liquid crystal polymer sheet 1C is illustrated in FIG. 3, but actually this interface does not necessarily appear clearly. When the interface between the porous liquid crystal polymer sheet 1B and the porous liquid crystal polymer sheet 1C does not appear clearly, the plane passing through the center of the cross section of the metal layer 2B in the stacking direction and lying in the direction perpendicular to the stacking direction in the cross section in the stacking direction as illustrated in FIG. 3 is regarded as the interface between the porous liquid crystal polymer sheet 1B and the porous liquid crystal polymer sheet 1C.

Like the porous liquid crystal polymer sheet 1, the porous liquid crystal polymer sheet 1A, the porous liquid crystal polymer sheet 1B, the porous liquid crystal polymer sheet 1C have a melt viscosity of 20 Pa·s or more under the conditions of a shear rate of 1000 $s^{-1}$ and a measurement temperature that is 20° C. higher than the melting point of the resin sheet of each of the porous liquid crystal polymer sheets. In the porous liquid crystal polymer sheet 1A, the porous liquid crystal polymer sheet 1B, and the porous liquid crystal polymer sheet 1C, the pores are unlikely to collapse under high temperature and high pressure as in the porous liquid crystal polymer sheet 1.

Since the electronic circuit board 50 includes the porous liquid crystal polymer sheet 1A, the porous liquid crystal polymer sheet 1B, and the porous liquid crystal polymer sheet 1C, the electronic circuit board 50 tends to have improved dielectric properties in a high-frequency region. The electronic circuit board 50 undergoes less change in dielectric properties caused by moisture absorption.

All of the porous liquid crystal polymer sheet 1A, the porous liquid crystal polymer sheet 1B, and the porous liquid crystal polymer sheet 1C preferably have a melt viscosity of 20 Pa·s or more under the above conditions, but one or some of the porous liquid crystal polymer sheets may have a melt viscosity of 20 Pa·s or more under the above conditions.

Preferred properties of the porous liquid crystal polymer sheet 1A, the porous liquid crystal polymer sheet 1B, and the porous liquid crystal polymer sheet 1C are the same as those of the porous liquid crystal polymer sheet 1 described above.

The porous liquid crystal polymer sheet 1A, the porous liquid crystal polymer sheet 1B, and the porous liquid crystal polymer sheet 1C may have the same thickness or different thicknesses, or one or some of the porous liquid crystal polymer sheets may have a different thickness as illustrated in FIG. 3.

Examples of the constituent material of the metal layer 2A, the metal layer 2B, the metal layer 2B', the metal layer 2B", and the metal layer 2C include copper, silver, aluminum, stainless steel, nickel, gold, and alloys containing at least one of these metals, which are the same as examples of the constituent material of the metal layer 2.

Like the metal layer 2, the metal layer 2A, the metal layer 2B, the metal layer 2B', the metal layer 2B", and the metal layer 2C are preferably composed of copper foil. In this case, the surface of the copper foil may be plated with a metal other than copper.

The metal layer 2A, the metal layer 2B, the metal layer 2B', the metal layer 2B", and the metal layer 2C are preferably made of the same constituent material, but may be made of different constituent materials, or one or some of the metal layers may be made of a different constituent material.

The metal layer 2A, the metal layer 2B, the metal layer 2B', the metal layer 2B", and the metal layer 2C may have the same thickness as illustrated in FIG. 3, but may have different thicknesses, or one or some of the metal layers may have a different thickness.

The electronic circuit board 50 has three metal layer-attached porous liquid crystal polymer sheets in the stacking direction, but may have only one metal layer-attached porous liquid crystal polymer sheet or may have two or four or more metal layer-attached porous liquid crystal polymer sheets.

In other words, the electronic circuit board 50 includes at least one porous liquid crystal polymer sheet having a melt viscosity of 20 Pa·s or more under the above conditions. As long as the electronic circuit board 50 includes at least one porous liquid crystal polymer sheet having a melt viscosity of 20 Pa·s or more under the above conditions, the electronic circuit board 50 may include a porous liquid crystal polymer sheet having a melt viscosity of less than 20 Pa·s under the above conditions, or may include a non-porous liquid crystal polymer sheet.

As illustrated in FIG. 3, the electronic circuit board 50 preferably further includes an interconnecting conductor. The interconnecting conductor is connected to a metal layer so as to penetrate a porous liquid crystal polymer sheet in the stacking direction without penetrating the metal layer in the stacking direction. In the example illustrated in FIG. 3, the electronic circuit board 50 further includes an interconnecting conductor 20A, an interconnecting conductor 20B, an interconnecting conductor 20C, and an interconnecting conductor 20D.

The interconnecting conductor 20A is connected to the metal layer 2B' so as to penetrate the porous liquid crystal polymer sheet 1B in the stacking direction without penetrating the metal layer 2B' in the stacking direction. More specifically, the interconnecting conductor 20A is connected to the metal layer 2B' on the first main surface 1Ba side of the porous liquid crystal polymer sheet 1B while penetrating the porous liquid crystal polymer sheet 1B in the stacking direction. The interconnecting conductor 20A is connected to the metal layer 2A on the second main surface 1Bb side of the porous liquid crystal polymer sheet 1B. In other words, the metal layer 2A and the metal layer 2B' are electrically connected to each other with the interconnecting conductor 20A interposed therebetween.

The interconnecting conductor 20B is distant from the interconnecting conductor 20A and connected to the metal layer 2B" so as to penetrate the porous liquid crystal polymer sheet 1B in the stacking direction without penetrating the metal layer 2B" in the stacking direction. More specifically, the interconnecting conductor 20B is distant from the interconnecting conductor 20A and connected to the metal layer 2B" on the first main surface 1Ba side of the porous liquid crystal polymer sheet 1B while penetrating the porous liquid crystal polymer sheet 1B in the stacking direction. The interconnecting conductor 20B is distant from the interconnecting conductor 20A and connected to the metal layer 2A on the second main surface 1Bb side of the porous liquid crystal polymer sheet 1B. In other words, the metal layer 2A and the metal layer 2B" are electrically connected to each other with the interconnecting conductor 20B interposed therebetween.

The interconnecting conductor 20C is connected to the metal layer 2C so as to penetrate the porous liquid crystal polymer sheet 1C in the stacking direction without penetrating the metal layer 2C in the stacking direction. More specifically, the interconnecting conductor 20C is connected to the metal layer 2C on the first main surface 1Ca side of the porous liquid crystal polymer sheet 1C while penetrating the porous liquid crystal polymer sheet 1C in the stacking direction. The interconnecting conductor 20C is connected to the metal layer 2B' on the second main surface 1Cb side of the porous liquid crystal polymer sheet 1C. In other words, the metal layer 2B' and the metal layer 2C are electrically connected to each other with the interconnecting conductor 20C interposed therebetween.

The interconnecting conductor 20D is distant from the interconnecting conductor 20C and connected to the metal layer 2C so as to penetrate the porous liquid crystal polymer sheet 1C in the stacking direction without penetrating the metal layer 2C in the stacking direction. More specifically, the interconnecting conductor 20D is distant from the interconnecting conductor 20C and connected to the metal layer 2C on the first main surface 1Ca side of the porous liquid crystal polymer sheet 1C while penetrating the porous liquid crystal polymer sheet 1C in the stacking direction. The interconnecting conductor 20D is distant from the interconnecting conductor 20C and connected to the metal layer 2B" on the second main surface 1Cb side of the porous liquid crystal polymer sheet 1C. In other words, the metal layer 2B" and the metal layer 2C are electrically connected to each other with the interconnecting conductor 20D interposed therebetween.

In the electronic circuit board 50, the metal layer 2A and the metal layer 2C are thus electrically connected to each other with the interconnecting conductor 20A, the metal layer 2B', and the interconnecting conductor 20C interposed therebetween. In the electronic circuit board 50, the metal layer 2A and the metal layer 2C are also electrically connected to each other with the interconnecting conductor 20B, the metal layer 2B", and the interconnecting conductor 20D interposed therebetween.

The interconnecting conductor 20A is formed by, for example, plating the inner wall of a via hole or performing a heat treatment after filling the via hole with a conductive paste, wherein the via hole penetrates the porous liquid crystal polymer sheet 1B in the thickness direction to reach the metal layer 2B' without penetrating the metal layer 2B' in the thickness direction.

The interconnecting conductor 20B, the interconnecting conductor 20C, and the interconnecting conductor 20D are also formed in the same manner as for the interconnecting conductor 20A except the positions at which the interconnecting conductors are formed.

When the interconnecting conductor 20A, the interconnecting conductor 20B, the interconnecting conductor 20C, and the interconnecting conductor 20D are formed by plating, the metal constituting each of the interconnecting conductors is, for example, copper, tin, silver, or other metals. Of these metals, copper is preferred.

When the interconnecting conductor 20A, the interconnecting conductor 20B, the interconnecting conductor 20C, and the interconnecting conductor 20D are formed by the heat treatment of the conductive paste, the metal contained in each of the interconnecting conductors is, for example, copper, tin, silver, or other metals. In particular, the interconnecting conductors preferably contain copper, and more preferably contain copper and tin. For example, when the interconnecting conductor 20A contains copper and tin, and the metal layer 2B' is composed of copper foil, the interconnecting conductor 20A is alloyed with the metal layer 2B' at low temperatures, so that the interconnecting conductor 20A and the metal layer 2B' easily electrically communicate with each other. The same applies to other combinations of the interconnecting conductors and the metal layers.

When the interconnecting conductor 20A, the interconnecting conductor 20B, the interconnecting conductor 20C, and the interconnecting conductor 20D are formed by the heat treatment of the conductive paste, the resin contained in each of the interconnecting conductors preferably contains at least one thermosetting resin selected from the group consisting of epoxy resins, phenolic resins, polyimide resins, silicone resins or modified resins thereof, and acrylic resins, or at least one thermoplastic resin selected from the group consisting of polyamide resins, polystyrene resins, polymethacrylic resins, polycarbonate resins, and cellulose resins.

The electronic circuit board 50 may include the metal layer 2B as a signal wire for transmitting signals. In this case, the electronic circuit board 50 includes a transmission line.

The electronic circuit board 50 may include the metal layer 2B as a signal wire for transmitting signals and may include the metal layer 2A and the metal layer 2C as ground electrodes. In this case, the electronic circuit board 50 includes a stripline transmission line.

When the electronic circuit board 50 includes the transmission line described above, the metal layer 2B may be a signal wire for transmitting high-frequency signals.

When the electronic circuit board 50 includes a transmission line, the porous liquid crystal polymer sheet 1B and the porous liquid crystal polymer sheet 1C each having low permittivity in contact with the metal layer 2B, which is a signal wire, easily improve the transmission characteristics of the electronic circuit board 50.

The electronic circuit board 50 is produced by, for example, the following method.

<Step of Preparing Metal Layer-Attached Porous Liquid Crystal Polymer Sheet>

Figure 4:
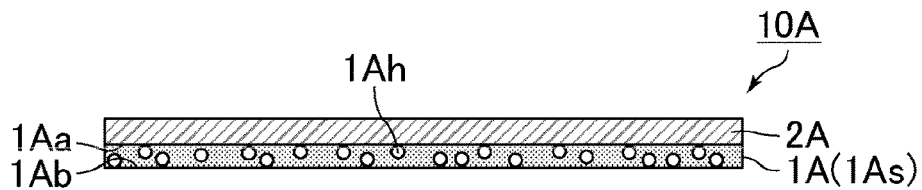
FIG. 4 is a schematic cross-sectional view of a step of preparing a metal layer-attached porous liquid crystal polymer sheet in an example method for producing the electronic circuit board of the present invention.
Figure 5:
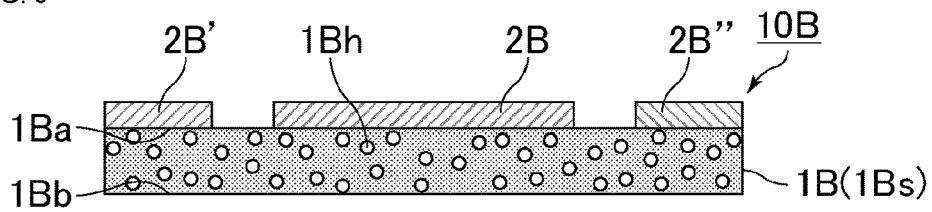
FIG. 5 is a schematic cross-sectional view of the step of preparing the metal layer-attached porous liquid crystal polymer sheet in the example method for producing the electronic circuit board of the present invention.
Figure 6:
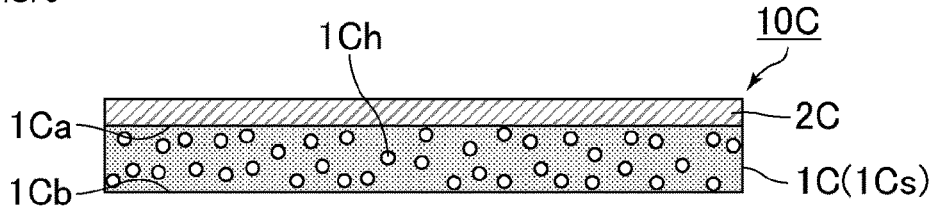
FIG. 6 is a schematic cross-sectional view of the step of preparing the metal layer-attached porous liquid crystal polymer sheet in the example method for producing the electronic circuit board of the present invention.

FIG. 4, FIG. 5, and FIG. 6 are schematic cross-sectional views of the step of preparing a metal layer-attached porous liquid crystal polymer sheet in an example method for producing the electronic circuit board of the present invention.

As illustrated in FIG. 4, the metal layer-attached porous liquid crystal polymer sheet 10A including the metal layer 2A on the first main surface 1Aa of the porous liquid crystal polymer sheet 1A is prepared. In this case, for example, the metal layer 2A is pressure-bonded to the first main surface 1Aa of the porous liquid crystal polymer sheet 1A.

As illustrated in FIG. 5, the metal layer-attached porous liquid crystal polymer sheet 10B including the metal layer 2B, the metal layer 2B', and the metal layer 2B" on the first main surface 1Ba of the porous liquid crystal polymer sheet 1B is prepared. In this case, for example, a metal layer is pressure-bonded to the first main surface 1Ba of the porous liquid crystal polymer sheet 1B, and the metal layer is then etched into a pattern of the metal layer 2B, the metal layer 2B', and the metal layer 2B". Alternatively, the metal layer 2B, the metal layer 2B', and the metal layer 2B" are prepared in advance, and each metal layer is pressure-bonded to the first main surface 1Ba of the porous liquid crystal polymer sheet 1B.

As illustrated in FIG. 6, the metal layer-attached porous liquid crystal polymer sheet 10C including the metal layer 2C on the first main surface 1Ca of the porous liquid crystal polymer sheet 1C is prepared. In this case, for example, the metal layer 2C is pressure-bonded to the first main surface 1Ca of the porous liquid crystal polymer sheet 1C.

<Step of Forming Via Holes>

Figure 7:
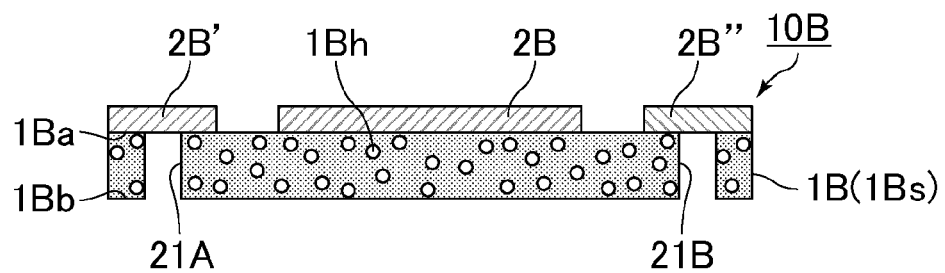
FIG. 7 is a schematic cross-sectional view of a step of forming via holes in the example method for producing the electronic circuit board of the present invention.
Figure 8:
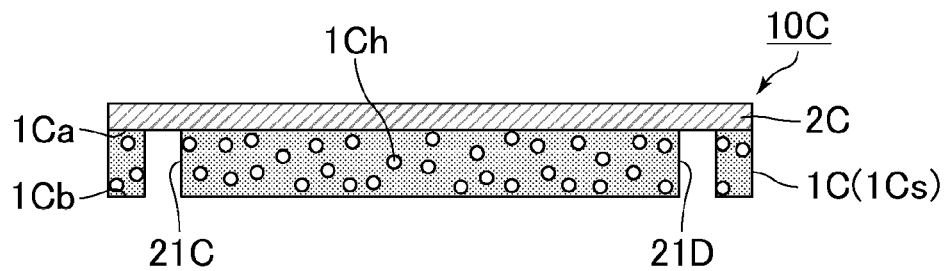
FIG. 8 is a schematic cross-sectional view of a step of forming via holes in the example method for producing the electronic circuit board of the present invention.

FIG. 7 and FIG. 8 are schematic cross-sectional views of the step of forming via holes in the example method for producing the electronic circuit board of the present invention.

As illustrated in FIG. 7, a via hole 21A is formed in the metal layer-attached porous liquid crystal polymer sheet 10B such that the via hole 21A penetrates the porous liquid crystal polymer sheet 1B in the thickness direction to reach the metal layer 2B' without penetrating the metal layer 2B' in the thickness direction. This process causes the metal layer 2B' to be partially exposed through the via hole 21A.

A via hole 21B is formed in the metal layer-attached porous liquid crystal polymer sheet 10B such that the via hole 21B penetrates the porous liquid crystal polymer sheet 1B in the thickness direction to reach the metal layer 2B" without penetrating the metal layer 2B" in the thickness direction. The via hole 21B is distant from the position at which the via hole 21A is to be formed. This process causes the metal layer 2B" to be partially exposed through the via hole 21B.

As described above, the via hole 21A and the via hole 21B are formed in the metal layer-attached porous liquid crystal polymer sheet 10B. In this case, the via hole 21A and the via hole 21B may be formed at the same time or at different times.

As illustrated in FIG. 8, a via hole 21C is formed in the metal layer-attached porous liquid crystal polymer sheet 10C such that the via hole 21C penetrates the porous liquid crystal polymer sheet 1C in the thickness direction to reach the metal layer 2C without penetrating the metal layer 2C in the thickness direction. This process causes the metal layer 2C to be partially exposed through the via hole 21C.

A via hole 21D is formed in the metal layer-attached porous liquid crystal polymer sheet 10C such that the via hole 21D penetrates the porous liquid crystal polymer sheet 1C in the thickness direction to reach the metal layer 2C without penetrating the metal layer 2C in the thickness direction. The via hole 21D is distant from the position at which the via hole 21C is to be formed. This process causes the metal layer 2C to be partially exposed through the via hole 21D.

As described above, the via hole 21C and the via hole 21D are formed in the metal layer-attached porous liquid crystal polymer sheet 10C. In this case, the via hole 21C and the via hole 21D may be formed at the same time or at different times.

The metal layer-attached porous liquid crystal polymer sheet is preferably irradiated with a laser beam from the porous liquid crystal polymer sheet side to form the via hole 21A, the via hole 21B, the via hole 21C, and the via hole 21D.

<Step of Applying Conductive Paste>

Figure 9:
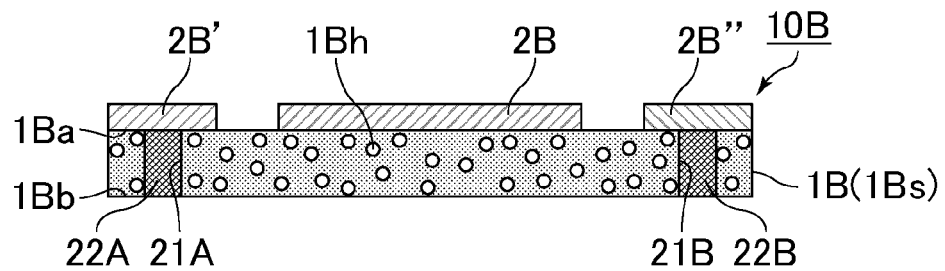
FIG. 9 is a schematic cross-sectional view of a step of applying a conductive paste in the example method for producing the electronic circuit board of the present invention.
Figure 10:
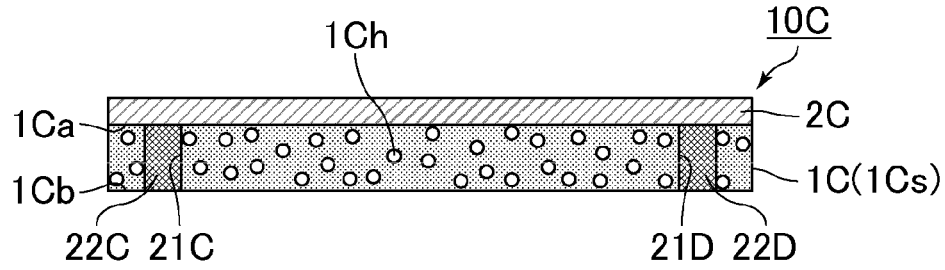
FIG. 10 is a schematic cross-sectional view of the step of applying the conductive paste in the example method for producing the electronic circuit board of the present invention.

FIG. 9 and FIG. 10 are schematic cross-sectional views of the step of applying a conductive paste in the example method for producing the electronic circuit board of the present invention.

As illustrated in FIG. 9, the via hole 21A in the metal layer-attached porous liquid crystal polymer sheet 10B is filled with a conductive paste 22A. The via hole 21B in the metal layer-attached porous liquid crystal polymer sheet 10B is filled with a conductive paste 22B. In this case, the via hole 21A and the via hole 21B may be respectively filled with the conductive paste 22A and the conductive paste 22B at the same time or at different times.

As illustrated in FIG. 10, the via hole 21C in the metal layer-attached porous liquid crystal polymer sheet 10C is filled with a conductive paste 22C. The via hole 21D in the metal layer-attached porous liquid crystal polymer sheet 10C is filled with a conductive paste 22D. In this case, the via hole 21C and the via hole 21D may be respectively filled with the conductive paste 22C and the conductive paste 22D at the same time or at different times.

The conductive paste 22A, the conductive paste 22B, the conductive paste 22C, and the conductive paste 22D are applied by, for example, screen printing or vacuum filling.

The conductive paste 22A, the conductive paste 22B, the conductive paste 22C, and the conductive paste 22D each contain, for example, a metal and a resin.

The metal contained in each of the conductive paste 22A, the conductive paste 22B, the conductive paste 22C, and the conductive paste 22D is, for example, copper, tin, silver, or other metals. In particular, each conductive paste preferably contains copper, and more preferably contains copper and tin.

The resin contained in each of the conductive paste 22A, the conductive paste 22B, the conductive paste 22C, and the conductive paste 22D preferably includes at least one thermosetting resin selected from the group consisting of epoxy resins, phenolic resins, polyimide resins, silicone resins or modified resins thereof, and acrylic resins, or at least one thermoplastic resin selected from the group consisting of polyamide resins, polystyrene resins, polymethacrylic resins, polycarbonate resins, and cellulose resins.

The conductive paste 22A, the conductive paste 22B, the conductive paste 22C, and the conductive paste 22D may each further contain, for example, vehicles, solvents, thixotropic agents, and activators.

Examples of the vehicles include rosin-based resins obtained from rosins and derivatives, such as modified rosins formed by modifying rosins; and synthetic resins obtained from rosins and derivatives, such as modified rosins formed by modifying rosins; and mixtures of these resins.

Examples of the rosin-based resins obtained from rosins and derivatives, such as modified rosins formed by modifying rosins, include gum rosin, tall rosin, wood rosin, polymerized rosin, hydrogenated rosin, formylated rosin, rosin ester, rosin-modified maleic resin, rosin-modified phenolic resin, rosin-modified alkyd resin, other various rosin derivatives.

Examples of the synthetic resins obtained from rosins and derivatives, such as modified resins formed by modifying rosins include polyester resins, polyamide resins, phenoxy resins, and terpene resins.

Examples of the solvents include alcohols, ketones, esters, ethers, aromatics, and hydrocarbons. Specific examples include benzyl alcohol, ethanol, isopropyl alcohol, butanol, diethylene glycol, ethylene glycol, glycerol, ethyl cellosolve, butyl cellosolve, ethyl acetate, butyl acetate, butyl benzoate, diethyl adipate, dodecane, tetradecene, α-terpineol, terpineol, 2-methyl-2,4-pentanediol, 2-ethylhexanediol, toluene, xylene, propylene glycol monophenyl ether, diethylene glycol monohexyl ether, ethylene glycol monobutyl ether, diethylene glycol monobutyl ether, diethylene glycol monoethyl ether, diisobutyl adipate, hexylene glycol, cyclohexane dimethanol, 2-terpinyloxy ethanol, 2-dihydroterpinyloxy ethanol, and mixtures thereof. Preferred among these are terpineol, ethylene glycol monobutyl ether, diethylene glycol monobutyl ether, or diethylene glycol monoethyl ether.

Examples of the thixotropic agents include hydrogenated castor oil, carnauba wax, amides, hydroxy fatty acids, dibenzylidene sorbitol, bis(p-methylbenzylidene)sorbitol, beeswax, stearamide, and ethylenebisamide hydroxystearate. These thixotropic agents may further contain, as needed, fatty acids, such as caprylic acid, lauric acid, myristic acid, palmitic acid, stearic acid, and behenic acid; hydroxy fatty acids, such as 1,2-hydroxystearic acid; antioxidants; surfactants; and amines.

Examples of the activators include amine hydrohalides, organohalogen compounds, organic acids, organic amines, and polyhydric alcohols.

Examples of the amine hydrohalides include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

Examples of the organohalogen compounds include chlorinated paraffins, tetrabromoethane, dibromopropanol, 2,3-dibromo-1,4-butanediol, 2,3-dibromo-2-butene-1,4-diol, and tris(2,3-dibromopropyl) isocyanurate.

Examples of the organic acids include malonic acid, fumaric acid, glycolic acid, citric acid, malic acid, succinic acid, phenyl succinic acid, maleic acid, salicylic acid, anthranilic acid, glutaric acid, suberic acid, adipic acid, sebacic acid, stearic acid, abietic acid, benzoic acid, trimellitic acid, pyromellitic acid, and dodecanoic acid.

Examples of the organic amines include monoethanolamine, diethanolamine, triethanolamine, tributylamine, aniline, and diethylaniline.

Examples of the polyhydric alcohols include erythritol, pyrogallol, and ribitol.

<Step of Forming Interconnecting Conductors>

Figure 11:
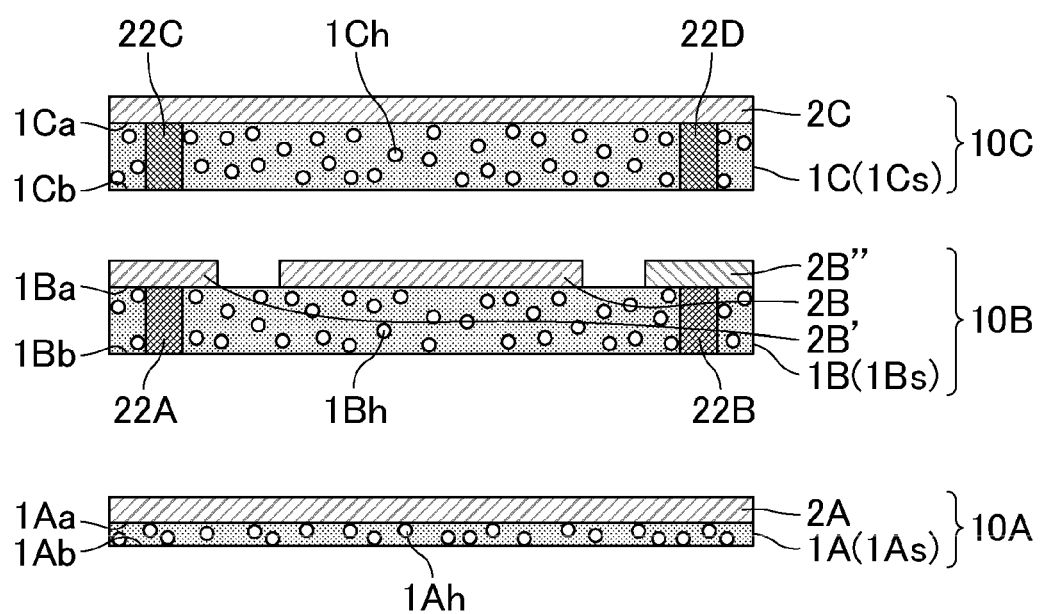
FIG. 11 is a schematic cross-sectional view of a step of forming interconnecting conductors in the example method for producing the electronic circuit board of the present invention.

FIG. 11 is a schematic cross-sectional view of a step of forming interconnecting conductors in the example method for producing the electronic circuit board of the present invention.

As illustrated in FIG. 11, the metal layer-attached porous liquid crystal polymer sheet 10A, the metal layer-attached porous liquid crystal polymer sheet 10B filled with the conductive paste 22A and the conductive paste 22B, and the metal layer-attached porous liquid crystal polymer sheet 10C filled with the conductive paste 22C and the conductive paste 22D are stacked in order in the stacking direction. At this time, the metal layer-attached porous liquid crystal polymer sheets 10A, 10B, and 10C are stacked such that the surface (upper surface) of the metal layer 2A of the metal layer-attached porous liquid crystal polymer sheet 10A is in contact with the surface (lower surface) of the porous liquid crystal polymer sheet 1B of the metal layer-attached porous liquid crystal polymer sheet 10B, and the surfaces (upper surfaces) of the metal layers 2B (metal layer 2B' and metal layer 2B") of the metal layer-attached porous liquid crystal polymer sheet 10B are in contact with the surface (lower surface) of the porous liquid crystal polymer sheet 1C of the metal layer-attached porous liquid crystal polymer sheet 10C. In FIG. 11, the metal layer-attached porous liquid crystal polymer sheets are illustrated at a distance from each other for convenience of description.

The obtained multilayer body is hot-pressed by applying pressure in the stacking direction with heating. In this process, the metal layer-attached porous liquid crystal polymer sheet 10A is pressure-bonded to the metal layer-attached porous liquid crystal polymer sheet 10B, and the metal layer-attached porous liquid crystal polymer sheet 10B is pressure-bonded to the metal layer-attached porous liquid crystal polymer sheet 10C. The conductive paste 22A, the conductive paste 22B, the conductive paste 22C, and the conductive paste 22D are solidified by hot pressing into the interconnecting conductor 20A, the interconnecting conductor 20B, the interconnecting conductor 20C, and the interconnecting conductor 20D, respectively. The interconnecting conductor 20A, the interconnecting conductor 20B, the interconnecting conductor 20C, and the interconnecting conductor 20D are thus formed in the via hole 21A, the via hole 21B, the via hole 21C, and the via hole 21D, respectively.

To form the interconnecting conductor 20A, the interconnecting conductor 20B, the interconnecting conductor 20C, and the interconnecting conductor 20D, the inner walls of the via holes may be plated with a metal, such as copper, tin, or silver, instead of filling the via holes with the conductive paste.

The electronic circuit board 50 illustrated in FIG. 3 is produced as described above.

EXAMPLES

Examples, which more specifically disclose the porous liquid crystal polymer sheet of the present invention, will be described below. The present invention is not limited only to the following Examples.

A porous resin sheet A and a porous resin sheet B were produced by the following method.

<Porous Resin Sheet A>

First, a liquid crystal polymer A was prepared. The liquid crystal polymer A was a copolymer of p-hydroxybenzoic acid and 6-hydroxy-2-naphthoic acid at a molar ratio of p-hydroxybenzoic acid to 6-hydroxy-2-naphthoic acid of 80:20. Next, a resin material A was prepared by mixing 99.6 parts by weight of the liquid crystal polymer A and 0.4 parts by weight of a blowing agent "VINYFOR AC #6-K6" (main component: azodicarbonamide) available from Eiwa Chemical Ind. Co., Ltd. The resin material A was molded into a porous resin sheet A with the properties shown in Table 1 by T-die molding.

<Porous Resin Sheet B>

First, a liquid crystal polymer B was prepared. The liquid crystal polymer B was a copolymer of p-hydroxybenzoic acid and 6-hydroxy-2-naphthoic acid at a molar ratio of p-hydroxybenzoic acid to 6-hydroxy-2-naphthoic acid of 73:27. Next, a resin material B was prepared by mixing 99.8 parts by weight of the liquid crystal polymer B and 0.2 parts by weight of a blowing agent "VINYFOR AC #6-K6" available from Eiwa Chemical Ind. Co., Ltd. The resin material B was molded into a porous resin sheet B with the properties shown in Table 1 by T-die molding.

The methods for measuring the properties shown in Table 1 are described below.

TABLE 1

| | | Porous Resin Sheet | |
|---|---|---|---|
| | | A | B |
| Melting point | °C. | 325 | 280 |
| Porosity | vol % | 50 | 35 |
| Melt viscosity | Pa·s | 19 | 14 |
| Melt tension | mN | 2.0 | 2.7 |

Example 1

First, the porous resin sheet A was heated from 23° C. to 250° C. over 1 hour in a nitrogen atmosphere, subsequently heated from 250° C. to 310° C. over 10 hours, and then maintained at 310° C. for 6 hours, whereby the liquid crystal polymer was subjected to solid phase polymerization. The porous resin sheet A after solid phase polymerization was then repeatedly irradiated with an electron beam with an acceleration voltage of 200 kV at a dose of 250 kGy until the total radiation dose reached 1000 kGy in a nitrogen atmosphere, whereby the liquid crystal polymer was exposed to electron beam irradiation. A porous liquid crystal polymer sheet of Example 1 was produced accordingly.

Example 2

A porous liquid crystal polymer sheet of Example 2 was produced in the same manner as for the porous liquid crystal polymer sheet of Example 1 except that the liquid crystal polymer was not exposed to electron beam irradiation.

Example 3

A porous liquid crystal polymer sheet of Example 3 was produced in the same manner as for the porous liquid crystal polymer sheet of Example 1 except that the liquid crystal polymer was not subjected to solid phase polymerization.

Example 4

First, the porous resin sheet B was heated from 23° C. to 250° C. over 1 hour in a nitrogen atmosphere, subsequently heated from 250° C. to 270° C. over 10 hours, and then maintained at 270° C. for 6 hours, whereby the liquid crystal polymer was subjected to solid phase polymerization. The porous resin sheet B after solid phase polymerization was then repeatedly irradiated with an electron beam with an acceleration voltage of 200 kV at a dose of 250 kGy until the total radiation dose reached 1000 kGy in a nitrogen atmosphere, whereby the liquid crystal polymer was exposed to electron beam irradiation. A porous liquid crystal polymer sheet of Example 4 was produced accordingly.

Example 5

A porous liquid crystal polymer sheet of Example 5 was produced in the same manner as for the porous liquid crystal polymer sheet of Example 4 except that the liquid crystal polymer was not exposed to electron beam irradiation.

Example 6

A porous liquid crystal polymer sheet of Example 6 was produced in the same manner as for the porous liquid crystal polymer sheet of Example 4 except that the liquid crystal polymer was not subjected to solid phase polymerization.

Comparative Example 1

The porous resin sheet A was used as a porous liquid crystal polymer sheet of Comparative Example 1.

Comparative Example 2

The porous resin sheet B was used as a porous liquid crystal polymer sheet of Comparative Example 2.

[Evaluation]

The porous liquid crystal polymer sheets of Examples 1 to 6, Comparative Example 1, and Comparative Example 2 were subjected to the following measurements. The results are shown in Table 2.

<Melting Point>

First, a porous liquid crystal polymer sheet was heated at a heating rate of 20° C./min and completely melted by using a differential scanning calorimeter "DSC 7000X" available from Hitachi High-Tech Science Corporation. The obtained melted material was then cooled to 175° C. at a cooling rate of 20° C./min and then heated at a heating rate of 20° C./min again. The temperature corresponding to the endothermic peak observed in this heating process was defined as the melting point of the porous liquid crystal polymer sheet. If it was difficult to observe the endothermic peak by the method described above, the melting point of the porous liquid crystal polymer sheet was determined by observing the texture under crossed Nicols in a polarizing microscope.

<Porosity>

First, a 100 mm square sample was cut out from the porous liquid crystal polymer sheet, and the area s, thickness t, and weight m of the sample were measured. The specific gravity o of the resin component of the porous liquid crystal polymer sheet was measured in accordance with JIS Z 8807-2012. The porosity of the porous liquid crystal polymer sheet was calculated based on the following formula: porosity (vol %)=[1−(m/(s×t×o)]×100.

<Melt Viscosity>

The melt viscosity of the porous liquid crystal polymer sheet was measured by using Capilograph "F-1" available from Toyo Seiki Seisaku-sho, Ltd. under the conditions of a shear rate of 1000 s$^{-1}$ and a measurement temperature that is 20° C. higher than the melting point of the porous liquid crystal polymer sheet measured by the method described above. At this time, the barrel diameter of the cylinder was 9.55 mm, and the capillary diameter was 1 mm.

<Melt Tension>

The melt tension of the porous liquid crystal polymer sheet was measured at the above measurement temperature by using Capilograph "F-1" available from Toyo Seiki Seisaku-sho, Ltd. At this time, the barrel diameter of the cylinder was 9.55 mm, the capillary diameter was 1 mm, and the strand winding speed was 150 m/min.

<Thickness Reduction>

First, a 100 mm square sample was cut out from the porous liquid crystal polymer sheet, and the thickness of the sample was defined as the thickness A before pressure bonding. Next, a copper foil with a thickness of 12 µm was stacked on one main surface of the sample, and the obtained multilayer body was hot-pressed by applying a pressure of 0.5 MPa at the above measurement temperature for 10 seconds, whereby the copper foil was pressure-bonded to the sample. The copper foil was then etched by using ferric chloride, and the thickness of the remaining sample was defined as the thickness B after pressure bonding. The thickness A before pressure bonding and the thickness B after pressure bonding were measured in the same manner as in the method for measuring the thickness of the porous liquid crystal polymer sheet described above. The thickness reduction of the porous liquid crystal polymer sheet from before to after pressure bonding was calculated based on the following formula: thickness reduction (%)=(1−"thickness B after pressure bonding"/"thickness A before pressure bonding")×100. The thickness reduction of the porous liquid crystal polymer sheet from before to after pressure bonding was evaluated based on the following criteria.

A (excellent): The thickness reduction was less than 1%.
B (good): The thickness reduction was 1% to 5%.
C (poor): The thickness reduction was more than 5%.

TABLE 2

|  |  | Example 1 | Example 2 | Example 3 | Example 4 | Example 5 | Example 6 | Comparative Example 1 | Comparative Example 2 |
|---|---|---|---|---|---|---|---|---|---|
| Melting point | ° C. | 327 | 330 | 324 | 284 | 285 | 277 | 325 | 280 |
| Porosity | vol % | 50 | 50 | 50 | 35 | 35 | 35 | 50 | 35 |
| Melt viscosity | Pa·s | 198 | 121 | 40 | 154 | 83 | 21 | 19 | 14 |
| Melt tension | mN | 6.1 | 2.3 | 5.3 | 6.8 | 2.9 | 6.0 | 2.0 | 2.7 |
| Thickness reduction | $% | 0.2 | 4.5 | 0.7 | 0.4 | 1.7 | 0.9 | 6.2 | 5.3 |
|  | Level | A | B | A | A | B | A | C | C |

Referring to Table 2, the porous liquid crystal polymer sheets of Examples 1 to 6 having a melt viscosity of 20 Pa·s or more exhibited a thickness reduction as low as 5% or less. It can thus be said that, since the porous liquid crystal polymer sheets of Examples 1 to 6 exhibited a low thickness reduction, the pores were unlikely to collapse under high temperature and high pressure upon pressure bonding of the copper foil to the porous liquid crystal polymer sheet. Therefore, the porous liquid crystal polymer sheets may tend to have an effect on permittivity reduction in the electronic circuit boards produced by using the porous liquid crystal polymer sheets of Examples 1 to 6, and the electronic circuit boards may tend to have improved dielectric properties in a high-frequency region.

Of the porous liquid crystal polymer sheets of Examples 1 to 6, the porous liquid crystal polymer sheets of Example 1, Example 3, Example 4, and Example 6 having a melt tension of 3 mN or more exhibited a thickness reduction of less than 1%. It can thus be said that, in the porous liquid crystal polymer sheets of Example 1, Example 3, Example 4, and Example 6 exhibiting a significantly low thickness reduction, the pores were much less likely to collapse under high temperature and high pressure upon pressure bonding of the copper foil to the porous liquid crystal polymer sheets.

The porous liquid crystal polymer sheets of Comparative Example 1 and Comparative Example 2 having a melt viscosity of less than 20 Pa·s exhibited a thickness reduction of more than 5%. It can thus be said that, in the porous liquid crystal polymer sheets of Comparative Example 1 and Comparative Example 2 exhibiting a high thickness reduction, the pores easily collapsed under high temperature and high pressure upon pressure bonding of the copper foil to the porous liquid crystal polymer sheets.

REFERENCE SIGNS LIST 1, 1A, 1B, 1C Porous liquid crystal polymer sheet
1a, 1Aa, 1Ba, 1Ca First main surface of porous liquid crystal polymer sheet
1b, 1Ab, 1Bb, 1Cb Second main surface of porous liquid crystal polymer sheet
1h, 1Ah, 1Bh, 1Ch Pore
1s, 1As, 1Bs, 1Cs Resin sheet
2, 2A, 2B, 2B', 2B", 2C Metal layer
10, 10A, 10B, 10C Metal layer-attached porous liquid crystal polymer sheet
20A, 20B, 20C, 20D Interconnecting conductor
21A, 21B, 21C, 21D Via hole
22A, 22B, 22C, 22D Conductive paste
50 Electronic circuit board

The invention claimed is:

1. A porous liquid crystal polymer sheet comprising a resin sheet containing a liquid crystal polymer and having pores, wherein the resin sheet has a closed-pore structure, and wherein the porous liquid crystal polymer sheet has a melt viscosity of 20 Pa·s or more under conditions of a shear rate of 1000 $s^{-1}$ and a measurement temperature that is 20° C. higher than a melting point of the resin sheet.

2. The porous liquid crystal polymer sheet according to claim 1, wherein the melt viscosity of the porous liquid crystal polymer sheet is 20 Pa·s to 500 Pa·s under the conditions of the shear rate of 1000 $s^{-1}$ and the measurement temperature that is 20° C. higher than the melting point of the resin sheet.

3. The porous liquid crystal polymer sheet according to claim 1, wherein the liquid crystal polymer is a solid phase polymerized liquid crystal polymer.

4. The porous liquid crystal polymer sheet according to claim 1, wherein the porous liquid crystal polymer sheet has a melt tension of 3 mN or more at the measurement temperature.

5. The porous liquid crystal polymer sheet according to claim 4, wherein the melt tension of the porous liquid crystal polymer sheet is 3 mN to 20 mN at the measurement temperature.

6. The porous liquid crystal polymer sheet according to claim 1, wherein the melting point of the resin sheet is 275° C. to 330° C.

7. The porous liquid crystal polymer sheet according to claim 1, wherein the liquid crystal polymer contains a copolymer of p-hydroxybenzoic acid and 6-hydroxy-2-naphthoic acid.

8. The porous liquid crystal polymer sheet according to claim 7, wherein the liquid crystal polymer contains 10 mol % or more of the p-hydroxybenzoic acid and 10 mol % or more of the 6-hydroxy-2-naphthoic acid with respect to 100 mol % of a total monomer content.

9. The porous liquid crystal polymer sheet according to claim 7, wherein a molar ratio of the p-hydroxybenzoic acid to the 6-hydroxy-2-naphthoic acid in the liquid crystal polymer is 0.20 to 5.

10. The porous liquid crystal polymer sheet according to claim 9, wherein the liquid crystal polymer contains 10 mol % or more of the p-hydroxybenzoic acid and 10 mol % or more of the 6-hydroxy-2-naphthoic acid with respect to 100 mol % of a total monomer content.

11. The porous liquid crystal polymer sheet according to claim 1, wherein the porous liquid crystal polymer sheet has a thickness of 10 μm to 200 μm.

12. A metalized porous liquid crystal polymer sheet comprising:
   the porous liquid crystal polymer sheet according to claim 1; and
   a metal layer on at least one main surface of the porous liquid crystal polymer sheet.

13. The metalized porous liquid crystal polymer sheet according to claim 12, wherein the metal layer is composed of copper foil.

14. An electronic circuit board comprising the metalized porous liquid crystal polymer sheet according to claim 12.

* * * * *